United States Patent [19]

Sajor et al.

[11] Patent Number: 4,646,332
[45] Date of Patent: Feb. 24, 1987

[54] TWISTED RING COUNTER WITH RECOVERABLE DISALLOWED STATES

[75] Inventors: Michael E. Sajor, Hackettstown; Asadolah Seghatoleslami, Haworth, both of N.J.

[73] Assignee: AT&T Bell Laboratories, Murray Hill, N.J.

[21] Appl. No.: 720,807

[22] Filed: Apr. 8, 1985

[51] Int. Cl.$^4$ .............................................. G11C 19/00
[52] U.S. Cl. ..................................... 377/124; 377/107
[58] Field of Search ............... 377/124, 126, 107, 116, 377/47, 48, 118, 64, 72, 73

[56] References Cited

U.S. PATENT DOCUMENTS 3,818,354  6/1974  Tomisawa et al. ................. 377/126
4,406,014  9/1983  Doron .............................. 377/107

FOREIGN PATENT DOCUMENTS 38938  9/1967  Japan .................................. 377/107
34572  3/1980  Japan .................................. 377/124

OTHER PUBLICATIONS

IBM Technical Disclosure Bulletin, "Reversible Counter", by D. T. Comer, vol. 7, No. 10, Mar. 1965.
"Multimoding and its Suppression in Twisted Ring Counters," *The Bell System Technical Journal*, Nov. 1968, W. Bleickardt, pp. 2029-2050.

*Primary Examiner*—John S. Heyman
*Assistant Examiner*—Karl Ohralik
*Attorney, Agent, or Firm*—Charles Scott Phelan

[57] ABSTRACT

A twisted ring counter has a NOR gate with inputs from outputs of the last two stages thereof to detect and be activated by a combination of outputs which is found in all modes of operation of the counter. When activated by the combination, the gate provides an output to reset the counter to an all-ZEROs condition.

5 Claims, 1 Drawing Figure

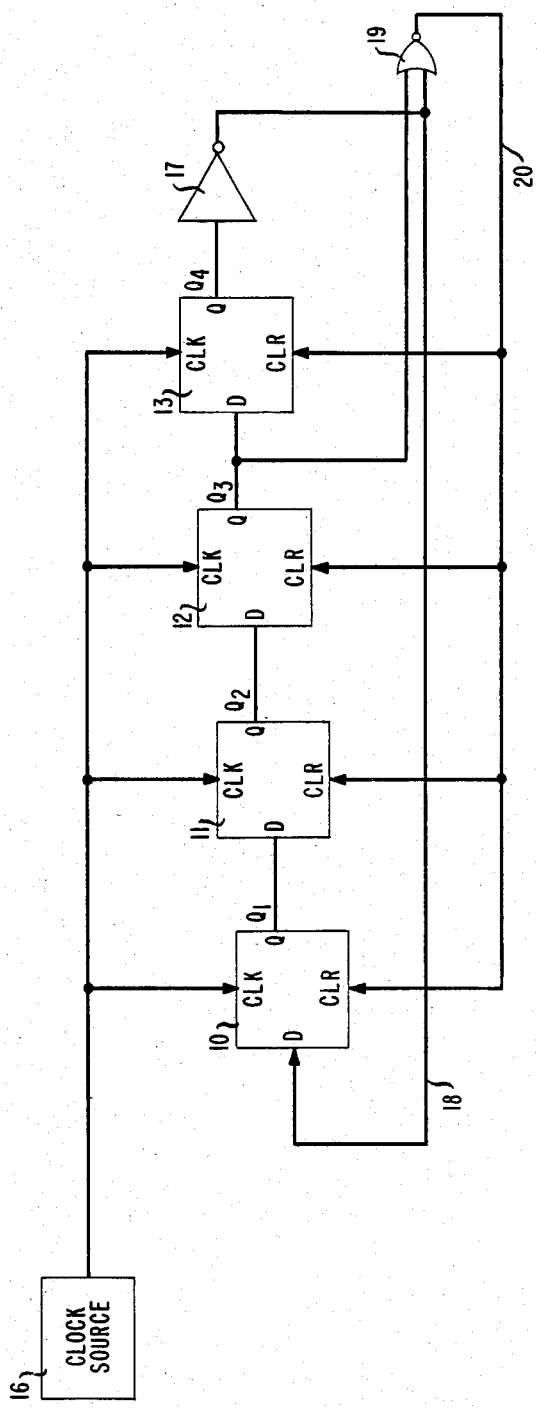

TWISTED RING COUNTER WITH RECOVERABLE DISALLOWED STATES

FIELD OF THE INVENTION

This invention relates to twisted ring counters; and it relates in particular to such counters with provision for recovering from disallowed states.

BACKGROUND OF THE INVENTION

Twisted ring counters, sometimes variously called cyclic sequential counters or Johnson counters or Moebius counters, are uniquely characterized by operation in accordance with a sequential pattern of states which recurs cyclically, a manner of operation not found, e.g., in binary counters. In that characteristic operation, regular clocking of the counter causes it to step through a normal-mode sequence of stage states in which an all-ONEs pattern of growing size appears to move from input to output and then be replaced by an all-ZEROs pattern of growing size. That cycle repeates continuously. A counter feedback circuit which inverts each bit fed back is instrumental in such performance. These counters are useful in many applications, especially those involving tens of stages, because only relatively simple logic is needed, compared, for example, to binary counters, to detect and output predetermined clock phase conditions.

However, such twisted ring counters are often not used because they are subject to being jumped into disallowed states by noise. A disallowed state is any state not included in the previously outlined repeating sequence, and it is said to be disallowed because in all cases a counter in one of those states is unable by only normal clocking to be returned to its proper sequence; so it is said to operate in an abnormal mode. By the time the faulty condition is discovered and corrected, system disarray can be caused by false outputs provided to counter output utilization circuits. A paper on the subject is "Multimoding and its Supression in Twisted Ring Counters," by W. Bleickardt, and appearing at pages 2029–2050 of the November 1968 *Bell System Technical Journal*. Bridging-type connections are there taught for use in restoring normal operation after detecting certain criteria which have been found to be common to all abnormal, or disallowed, modes but are not found in a normal mode of operation. Different forms of bridging are needed for different types of counter configurations.

A J. Doron U.S. Pat. No. 4,406,014 shows a switched frequency divider in which bistable devices are connected as a Johnson counter. A NAND gate is provided to detect an incorrect divider state, as indicated by the states of two separated stages, and reset an intermediate stage in an effort at least partially to correct the condition. It can be shown, however, that this technique does not work for all possible incorrect states of all sizes of the divider. For example, in an eight-stage divider, the binary condition 00110011, or its cyclic shifts, would not be detected or corrected because it would never include the 010 or the 101 conditions required by Doron to be in a Johnson operation sequence for correction to take place. In addition, the Doron counter corrects only one stage at a time; but in a noisy environment, additional errors could occur at such a fast rate that the divider may never by completely free of erroneous states.

SUMMARY OF THE INVENTION

The foregoing difficulties in clearing erroneous states from twisted ring counters are eased by detecting an adjacent-bit condition which occurs in all sequences of states, allowed or disallowed, and then resetting the counter to a predetermined allowed state. In one embodiment, the two right-most bits in the counter binary state . . . 01 are detected and the counter reset to the all-ZERO state, in this case the next state in the normal sequence of counter operation.

BRIEF DESCRIPTION OF THE DRAWING

A more complete understanding of the invention and its various features, objects, and advantages may be obtained from a consideration of the following Detailed Description in connection with the appended claims and the attached single-figure Drawing which includes a block diagram of a twisted ring in accordance with the invention.

DETAILED DESCRIPTION

A twisted ring counter according to the invention is shown in the drawing. It is illustratively shown as a four-stage counter, but the disallowed state recovery concept is applicable to counters of any number of stages, odd or even, as will be subsequently shown.

Four bistable circuits such as the D-type flip-flops 10–13, are connected in the style of a shift register with the Q output of each connected to the D input of the next in the shift register sequence. Any number of bistable circuit stages can be employed. A clock source 16 provides clock signals in parallel to the clock inputs of the flip-flops to enable each to sample the output of the prior stage in the sequence once each clock time. The Q output of the final stage 13 is applied through a binary signal inverter 17 and a feedback lead 18 to the D input of the first flip-flop stage of the sequence in the usual manner for switch twisted ring counters. In addition, the Q output of flip-flop 12, next to the last stage of the sequence, and the output of inverter 17 are coupled to inputs of a NOR gate 19 which has its output (high when both inputs are low) coupled through a clear lead 20 in parallel to clear inputs of all four flip-flops. Thus, it can be seen that the output of inverter 17 always causes the first flip-flop 10 to assume a state which is the opposite of the binary state of the last stage flip-flop 13 each time that the shift register is clocked. Likewise, the output of NOR gate 19 causes all flip-flop stages to be cleared to a predetermined pattern of states, illustratively the all-binary-ZERO-output state, each time that the gate detects a predetermined pattern of states in a lesser number of flip-flops, illustratively the coincidence of a ZERO Q output from flip-flop 12 with a ONE Q output from flip-flop 13, as inverted by 17.

Both Normal and Abnormal (disallowed) operations of the illustrated twisted ring counter are indicated in the following Table of Operating Cycle States. In the Table, the Q output signal states of the flip-flops 10–13 are indicated in columns $Q_1$ through $Q_4$, respectively.

| TABLE OF CYCLIC OPERATING STATES | | | | | | | | |
|---|---|---|---|---|---|---|---|---|
| CYCLE STEP NO. | NORMAL OPERATION | | | | ABNORMAL (DISALLOWED) OPERATION | | | |
| | $Q_1$ | $Q_2$ | $Q_3$ | $Q_4$ | $Q_1$ | $Q_2$ | $Q_3$ | $Q_4$ |
| 1 | 0 | 0 | 0 | 0 | 0 | 1 | 0 | 0 |

TABLE OF CYCLIC OPERATING STATES

| CYCLE STEP NO. | NORMAL OPERATION | | | | ABNORMAL (DISALLOWED) OPERATION | | | |
|---|---|---|---|---|---|---|---|---|
| | $Q_1$ | $Q_2$ | $Q_3$ | $Q_4$ | $Q_1$ | $Q_2$ | $Q_3$ | $Q_4$ |
| 2 | 1 | 0 | 0 | 0 | 1 | 0 | 1 | 0 |
| 3 | 1 | 1 | 0 | 0 | 1 | 1 | 0 | 1 |
| 4 | 1 | 1 | 1 | 0 | 0 | 1 | 1 | 0 |
| 5 | 1 | 1 | 1 | 1 | 1 | 0 | 1 | 1 |
| 6 | 0 | 1 | 1 | 1 | 0 | 1 | 0 | 1 |
| 7 | 0 | 0 | 1 | 1 | 0 | 0 | 1 | 0 |
| 8 | 0 | 0 | 0 | 1 | 1 | 0 | 0 | 1 |
| 1 | 0 | 0 | 0 | 0 | 0 | 1 | 0 | 0 |

The Normal operation of the counter starts with the all-ZERO state on start-up when, in the usual application, a clear signal would be applied to lead 20 from an external source (not shown) to assure starting in a predetermined state at that particular point in time. If the start-up state were not important in a particular application, no external start signal would be required because the counter would quickly operate itself into the proper normal operating sequence, as will be shown, regardless of the particular states in which the various flip-flops happened to come on. At the first clock time after turn-on, flip-flop 10 is set to the ONE state by the output from inverter 17. On each successive clock pulse, the pattern of ONEs grows and the pattern of ZEROs decreases until the counter has attained the all-ONEs state of Step No. 5 in the Table. Thereafter, each clock pulse causes the pattern of ZEROs to grow to the right as illustrated in the Table; and the pattern of ONEs decreases until Step No. 1 is repeated following Step No. 8. In the Normal operating sequence just outlined, the return to all-ZEROs state occurs because of the action of inverter 17 and because of the action of gate 19, either one actuating the clearing function on a logical OR basis.

The Table also shows cyclic operation for an abnormal, or disallowed, sequence of states which in the illustrated case includes in Step No. 1 the binary state pattern 0100 at the outputs of flip-flops 10–13, respectively. In the absence of consideration of gate 19, that pattern would be continuously rotated through the shift register stages and never allow return to the Normal sequence under the influence of only regular clocking. However, it can be seen in the Table that the . . . 01 partial pattern, i.e., the ZERO-ONE partial pattern in flip-flops 12 and 13 and "don't care" in all other flip-flop stages, occurs three times in a cycle of eight steps. As previously mentioned, the first occurrence of the indicated ZERO-ONE partial pattern activates gate 19 to produce output signal that is applied via lead 20 to reset all flip-flop stages of the register (not shown in Abnormal part of the Table), as though the register were making a Normal sequential transition from Step No. 8 back to Step No. 1. That action clears the entire counter and removes any other incorrect states in individual flip-flop stages all at once. In the worst case disallowed state pattern, no more than eight clock times, for the illustrative embodiment, need elapse before the counter is restored to normal operation; but often, as in the Abnormal case in the Table, an opportunity will arise for restoration in only a few clock times.

In order that it should not be necessary to go through a complete analysis of possible disallowed states for each new number of twisted ring counter stages, it is important that there be assurance that the foregoing technique of using a counter partial-state pattern which is common to all possible operating cyclic sequences, will indeed work for any counter configuration or number of stages. Such a proof follows.

Examination of the twisted ring counter in details shows that only 2N states are valid of $2^N$ possible for the shift register of length N. Obviously, without special treatment, if the register enters a disallowed state, there is no method of self-resolution, i.e., return to an allowed state. It is here shown that with the addition of a single gate, these disallowed states may be trapped, and resolved into known, allowed states.

The class of binary codes of interest here are codes that are generated by a shift register which has the inverted output of its last stage used as the input to the first stage. The code word f(x) resident in the shift register is represented by the following polynomial:

$$f(x) = a_{N-1}x^{N-1} + a_{N-2}x^{N-2} + \ldots + a_1x + a_0 \quad (1)$$

where $a_i$'s are binary numbers, and x is the variable which its power represents the position of $a_i$ in the shift register. A one-position shift of the above code word to the left can be written as follows:

$$C^1[f(x)] = xf(x) \bmod (x^N+1) + 1 \quad (2)$$

where $C^1$ indicates the one position shift of the code word. The one term in the right hand side indicates that the least significant bit of the shift register after the shift operation is the inverse of the most significant bit of the shift register prior to the shift operation. Note that additions are all modulo 2 additions. By the same reason a two position shift of the original code word can be written as:

$$C^2[f(x)] = x^2 f(x) \bmod (x^N+1) + x + 1 \quad (3)$$

and an n position cyclic shift of the original code word can be written as:

$$C^n[f(x)] = x^n f(x) \bmod (x^N+1) + x^{n-1} + x^{n-2} + \ldots + x + 1 \quad (4)$$

The polynomial f(x) is called the initial state of the shift register and any of the following shifts of the initial state are called the successor states of the shift register.

It will now be shown that any initial state of an N-bit shift register has at most 2N distinct successor states. In other words the successor states of an initial state are cyclic and repeat with a cycle length of 2N. The contents of the shift register after N shifts are:

$$C^N[f(x)] = x^N f(x) \bmod (x^N+1) + x^{N-1} + x^{N-2} + \ldots + x + 1 \quad (5)$$

The first term in the right hand side of the above equation can be rewritten as follows:

$$x^N[f(x)] \bmod (x^N+1) = [a_{N-1}x^{2N-1} + a_{N-2}x^{2N-2} + \ldots + a_1 x^{N-1} + a_0 x^N] \bmod (x^N+1) \quad (6)$$

or in other words:

$$x^N f(x) = f(x) \bmod (x^N+1) \quad (7)$$

Therefore an N-position shaft of the initial state can be written as:

$$C^N[f(x)] = f(x) + x^{N-1} + x^{N-2} + \ldots + x + 1 \quad (8)$$

Substituting for f(x) in the above equation and factoring the terms with common powers of x:

$$C^N[f(x)] = (a_{n-1}+1)x^{N-1} + (a_{N-1}+1)x^{N-1} + \ldots + (a_{N-1}+1)x + (a_0+1) \quad (9)$$

Since all additions are modulo 2, the above equation will reduce to:

$$C^N[f(x)] = \overline{a_{N-1}}x^{N-1} + \overline{a_{N-2}}x^{N-2} + \ldots + \overline{a_1}x + \overline{a_0} \quad (10)$$

where over-barred terms represent inverted binary bit patterns. Therefore an N-position cyclic shift of the initial state of an N-bit code will result in the inversion of all bits. Thus a 2N-position cyclic shift of the initial state will result in the initial state being restored.

Let S be the set of all code words of length N (all polynomials of degree N−1 with binary coefficients). The set S has $2^N$ elements. It has now been shown that all cyclic shifts of any initial state will result in a group of 2N−1 successor states. Therefore it must be possible to show that the set S is composed of a collection of mutually disjoint subsets with at most 2N elements each.

Let f(x) and g(x) be two polynomials of degree N−1 (i.e., elements of S). The polynomials f(x) and g(x) will be abbreviated as f and g where the argument of the function is implied. If g is a successor state of f, it will be shown as:

$$f \sim g \quad (11)$$

It is clear that ~ is a relation on S. It will now be shown that ~ is an equivalence relation. In order to show ~ is an equivalence relation on S it must be shown that it is reflexive, symmetric, and transitive. A zero position cyclic shift of a polynomial is by definition the polynomial itself.

$$C^0[f(x)] = f(x) \bmod (x^N+1) \quad (12)$$

Therefore any state is its own zeroth successor. Thus f~f which implies ~ is reflexive.

Let g be the successor state of f after p cyclic shifts.

$$g(x) = C^p[f(x)] \quad (13)$$

The successor state of g after q cyclic shifts will be:

$$C^q[g(x)] = x^q g(x) + x^{q-1} + x^{q-2} + \ldots + x + 1 \quad (14)$$

But since g is a p-position cyclic shift of f, the value of g(x) in terms of f(x) can be substituted in the above equation as:

$$C^q[g(x)] = x^q[x^p f(x) \bmod(x^N+1) + x^{p-1} + x^{q-2} + \ldots + x + 1] + x^{q-1} + x^{p-2} + \ldots + x + 1 \quad (15)$$

By combining the terms the following equation is obtained:

$$C^q[g(x)] = x^{q+p} f(x) \bmod(x^N+1) + x^{q+p-1} + x^{q+p-2} + \ldots + x^{q+1} + x^q + x^{q-1} + \ldots + x + 1 \quad (16)$$

The above equation can be summarized as follows:

$$C^q[g(x)] = C^q[C^p[f(x)]] = C^{p+q}[f(x)] \quad (17)$$

Or in other words a p-position shift followed by q-position shift of a state is equivalent to a p+q shift. Therefore the relation ~ is transitive.

Now choose q such that $p+q = 2N$.

$$C^q[g(x)] = C^{2N}[f(x)] = f(x) \bmod(x^N+1) \quad (18)$$

Therefore if g(x) is a p-position shift of f(x), then f(x) is a q-position shift of g(x) where $p+q = 2N$. Therefore the relation is symmetric.

Since the relation ~ is an equivalence relationship, it induces a partition on set S. Let A, B, C, ... be the members of the partition, then they are mutually disjoint and their union is equal to set S. Also the maximum number of elements of sets A, B, C, ... is 2N each. The partition implies that if the initial state is an element of one of the partition members, none of the successor states will be an element of any other member of the partition. Or in other words an initial state and all of its successor states are elements of the same member of the partition.

If the initial state is equal to an all-ZERO code word or one of its successor states, then the previously mentioned shift register implements what is known as a twisted ring counter. A twisted ring counter of length N has 2N distinct states. Therefore there are $2^N - 2N$ states that are not successor states to state zero. Thus if the counter enters any of these $2^N - 2N$ states, it will never return to a successor state of state zero unless it is forced into one. In general, the number of undesirable states is large and it is not possible to decode them in a brute force manner.

In a twisted ring counter, the predecessor state to the all-ZERO state has its most significant bit equal to one and all other bits equal to ZERO. This can be seen by a single-position cyclic shift of the polynomial $f(x) = x^{N-1}$.

$$C^1[f(x)] = (x(x^{N-1})) \bmod(x^N+1) + 1 = (x^N) \bmod(x^N+1) + 1 = 0 \quad (19)$$

It will now be shown that all members of the partition of the set S of all polynomials of degree N−1 induced by the equivalence relation ~ have a member in which its two most significant bits are 10.

We have already shown that this is true for the set of all successor states to state zero. The set of all successor states to state zero contains the all-ZERO and all-ONE code words. This is true because an N-position shift of the code word of all ZEROs will result in a code word of all ONEs. If a selected subset does not contain all ONEs or all ZEROs, it must contain a 10 or a 01 bit pattern in some location. Since we have already proven that after N cyclic shifts all of the bits of the code word will be inverted, it follows that the bit pattern 01 will be changed to 10. Thus, it is adequate to prove the case for the 10 pattern. If the pattern 10 is contained in locations p and p−1, then after N−p−1 cyclic shifts the bit pattern will be located in bit positions N−1 and N−2.

Thus, the most significant two bits of the predecessor state to state zero and the same two bits in some state of all other members of the partition contain the pattern 10. Therefore a decoder that decodes this pattern in the two most significant bit positions and resets the counter will not only return the counter to its initial state from any disallowed state but also it does not interfere with the normal operation of the counter.

Although the present invention has been described in connection with a particular embodiment thereof, it is to be understood that additional embodiments, applications, and modifications thereof, which will be apparent to those skilled in the art, are included within the spirit and scope of the invention.

What is claimed is:

1. In a multi-stage twisted ring counter for recurrently operating through a predetermined normal sequence of counting steps, each step comprising a different binary state pattern having no more than one stage in a binary one state adjacent to no more than one stage in a binary zero state,
    means for detecting occurrence of a predetermined binary state pattern for a plurality, less than all, of stages of said counter and which state pattern is common to all possible operating sequences of said counter, whether normal or abnormal, and
    means, responsive to said detecting means in the next one of said steps after detecting said common pattern, for setting said counter to a predetermined state of all stages thereof which is one step in a normal cyclic sequence of operation.

2. The counter of claim 1 in which
said detecting means comprises means for detecting a binary 01 state combination in the final two stages of the counter without regard for the states of other stages of the counter.

3. The counter in accordance with claim 2 in which
said setting means comprises means for resetting all stages of said counter to a binary ZERO state at substantially the same time.

4. The counter in accordance with claim 1 in which
said detecting means comprises
    a two-input logic gate, and
    means for coupling outputs of two final stages of said counter to inputs of said gate for detecting said common state pattern, and
said setting means comprises means for coupling an output of said gate to set all stages of said counter to said predetermined state.

5. A multi-stage twisted ring counter having a predetermined normal counting sequence of states in each of which there is no more than one state in a binary one state adjacent to no more than one stage in a binary zero state, the counter comprising
    means for detecting occurrence of a partial stage binary signal state pattern which is characteristic both of abnormal sequences of said counter and of the last normal operating step in the normal operating sequence of said counter prior to recycling to an initial step in said sequence, and
    means, responsive to said detecting means in the next operating step following detecting of said state pattern, for forcing said counter to recycle to said initial step.

* * * * *